(12) United States Patent
Oyama et al.

(10) Patent No.: US 7,674,651 B2
(45) Date of Patent: Mar. 9, 2010

(54) MOUNTING METHOD FOR SEMICONDUCTOR PARTS ON CIRCUIT SUBSTRATE

(75) Inventors: Yukifumi Oyama, Yasu (JP); Hidetoshi Nishiwaki, Otsu (JP); Toshihiko Nishio, Moriyama (JP); Kazushige Toriyama, Kyoto (JP); Yasumitsu Orii, Ohmi (JP)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 11/850,767

(22) Filed: Sep. 6, 2007

(65) Prior Publication Data

US 2008/0150135 A1 Jun. 26, 2008

(30) Foreign Application Priority Data

Dec. 26, 2006 (JP) .............................. 2006-349957

(51) Int. Cl.
*H01L 21/06* (2006.01)
*B23K 31/02* (2006.01)

(52) U.S. Cl. .................................... 438/106; 228/123.1

(58) Field of Classification Search ................ 257/738, 257/779, 780, 772, 737, E23.023, E21.506, 257/E23.01, E21.499, E21.509; 438/106, 438/26, 51, 616, 117; 228/110.1, 155, 180.5, 228/123.1, 178
See application file for complete search history.

(56) References Cited

U.S. PATENT DOCUMENTS 5,508,561 A 4/1996 Tago et al.
6,680,528 B2* 1/2004 Matsuo et al. .............. 257/700

2004/0232533 A1* 11/2004 Hatakeyama ............... 257/678
2006/0040488 A1* 2/2006 Fjelstad ..................... 438/597

FOREIGN PATENT DOCUMENTS

| JP | 06188289 | 8/1994 |
| JP | 7142488 | 6/1995 |
| JP | 7263450 | 10/1995 |
| JP | 2000232129 | 8/2000 |
| WO | PCT/JP2007/074463 | 3/2008 |

OTHER PUBLICATIONS

Wong et al., "Low Cost Flip Chip Bumping Technologies", 1997, IEEE/CPMT Electronic Packaging Technology Conference, pp. 244-250.*

* cited by examiner

*Primary Examiner*—Thomas L Dickey
*Assistant Examiner*—Nikolay Yushin
(74) *Attorney, Agent, or Firm*—Anthony J. Canale; David Cain

(57) ABSTRACT

A method for mounting a semiconductor part on a circuit substrate is provided, which includes preparing the semiconductor part having a surface thereof provided with a plurality of stud-bumps, preparing a solder substrate having a surface thereof on which solid-solders corresponding to respective ones of the plurality of stud-bumps are arranged, preparing the circuit substrate having a surface thereof provided with connecting pads corresponding to respective ones of the plurality of stud-bumps, attaching the corresponding solid-solders on the solder substrate to respective tip ends of the plurality of stud bumps, separating the solid-solders attached to the tip ends of the stud-bumps from the solder substrate, contacting the solid-solder attached to respective ones of the tip ends of the stud-bumps with the corresponding connecting pads, and heating the solid-solders contacted with the corresponding connecting pads thereby establishing solder connection between respective ones of the stud-bumps and the corresponding connecting pads.

1 Claim, 4 Drawing Sheets

MOUNTING METHOD FOR SEMICONDUCTOR PARTS ON CIRCUIT SUBSTRATE

FIELD OF THE INVENTION

The present invention generally relates to a method for mounting a semiconductor part or semiconductor parts on a circuit substrate. More particularly, the present invention relates to a method of connecting a semiconductor part having stud bumps with a circuit substrate having connection pads by using a solder.

BACKGROUND OF THE INVENTION

As a method of electrically connecting a semiconductor part or semiconductor parts to a circuit substrate, there is the flip-chip-bonding (FCB) method in which connection pads (electrode pads) of both are connected to one another by using a solder. As one of the FCB technology, there is a method referred to as (pre-coating method) in which a bump is provided for each of connection pads of semiconductor parts, and a solder layer is preliminarily provided on connecting pads of the circuit substrate. FIGS. 1A to 1C are schematic views for the explanatory illustration of the pre-coating method. Namely, a semiconductor part 1 provided with a bump 2 and a substrate 3 having thereon a connection pad 4 on which a solder layer 5 is provided are prepared (FIG. 1A). Positioning or aligning of the bumps 2 and the connection pads 4 is then performed and thereafter, both are brought into contact with one another (FIG. 1B). Heating is then applied to the solder layer 5 on the connection pad 4 to melt the solder thereby connecting bumps 2 and the connection pads 4 by the solder (FIG. 1C).

There are some problems in the conventional method illustrated in FIG. 1 as described below. When the connection pas 4 is comprised of copper (Cu) and when the material of the solder is an alloy of tin and silver (Sn—Ag), an intermetallic compound (Sn—Cu) is formed between the tin (Sn) contained in the solder and the copper (Cu) constituting the connection pad 4 due to heating (pre-coating heat) which is applied during provision of the solder layer 5 on the connection pad 4. As a result, the Sn atom in the solder is decreased while increasing the rate of the silver (Ag) therein, and therefore, the melting point of the solder goes up. Incidentally, even with the Sn—Pb eutectic solder made of tin (Sn) and lead (Pb), in the case where the ratio of the eutectic point of 63% Sn and 37% Pb changes, the melting point similarly goes up. In the case of the Sn—Ag system solder free of lead (Pb), this phenomena of increasing of the melting point is specifically noticeable.

When the melting point of the solder rises, it is necessary that a heating temperature for melting the solder shown in FIG. 1C must be increased. As a result, a difference in the extension (the thermal expansion) between a substrate and a semiconductor part, which is caused by a difference of the thermal expansion coefficient between the substrate and the semiconductor part increases. Therefore, a positional discrepancy between the stud bump 2 and the connection pad 4 as well as a flaw due to the curving of the substrate 3 occur. Further, the hardness of the crystal, i.e., the $Ag_3Sn$ crystal which is produced due to the twice melting of the solder upon pre-coating and upon soldering for the connection is very high and therefore, a crack is apt to occur in the hardened solder after melting thereof.

In a conventional method for avoiding the melting of the solder at the pre-coating, there has been provided a paste-transcription method. FIGS. 2A to 2C are schematic views illustrating the conventional paste-transcription method. Namely, a bump 2 of a semiconductor part 1 is immersed in a paste 7 (FIG. 2A). The solder paste 7 is a mixture of a solder particles and a flux having viscosity. Due to the viscosity of the flux, the solder paste 7 is attached to the surface of the bump 2 of the semiconductor part 1. Then, the bump 2 to which the solder paste 8 is attached is positionally aligned on the connection pad 4 on the substrate 3 (FIG. 2B). Thereafter, the bump 2 is heated, to melt the solder paste 8 so that the bump 2 and the connection pad 4 are connected together by the hardened solder 9 (FIG. 2C).

In the paste transcription method of FIG. 2, the melting of the solder is permitted to occur only once and accordingly, it is possible to mitigate the problems caused by the generation of the Sn—Cu intermetallic compound or the $Ag_3Sn$. Nevertheless, there are problems as described below with the paste transcription method. That is to say, when the viscosity of the flux in the solder paste is high, at the time of attaching the solder paste to the bumps, a continuity of the solder paste might occur while forming a bridging of the solder paste between neighboring bumps. On the contrary, when the viscosity of the flux in the solder paste is low, an amount of solder paste attaching to each bump is small. Therefore, in the former case, a short-circuiting might occur between the neighboring bumps after the melting of the solder, while in the latter case, a reduction in the strength of solder connection might take place causing electric disconnection. Consequently, both cases will eventually result in defective solder connection.

Japanese unexamined Patent Publications (Kokai) 06-188289 and 2000-232129 disclose such a method that electric connection between a semiconductor part and a circuit substrate is carried out without meting of solder upon doing the connection. In the disclosed prior art technique of these two publications, a contact pin on the substrate is permitted to pierce a ball-like solder bump on the semiconductor part to establish electric connection between both. However, since the contact pin is placed in a state of merely piercing the solder ball, strength of the connected portion is necessarily small, and an electric contact resistance in the connected portion is larger than the case where melting of the solder is carried out. Further, the prior art disclosed in the above-mentioned two publications takes the way of preliminarily providing a solder bump on an electrode pad of the semiconductor part, and accordingly is different from the conventional methods of FIGS. 1 and 2 in which a solder layer is preliminarily provided on a circuit substrate side.

SUMMARY OF THE INVENTION

An aspect of the present invention is to provide a method for connection of a stud-bump of a semiconductor part and a connecting pad of a circuit substrate by only one-time melting of a solder.

Another aspect of the present invention is to provide a method for connecting stud-bumps of a semiconductor part with connecting pads on a circuit substrate by solder under such a condition that all of the stud-bumps are beforehand supplied with an equal amount of solder.

A further aspect of the present invention is to provide a method for connecting stud-bumps of a semiconductor part with copper (Cu)-made connecting pads of a circuit substrate by solder, wherein the method is capable of alleviating generation of an intermetallic compound of tin and copper (Sn—Cu).

A still further aspect of the present invention is to provide a method for connecting stud-bumps of a semiconductor part with a circuit substrate by the employment of a lead (Pb)-free solder, wherein the method is capable of suppressing a rise in the reflow-temperature of the solder.

In accordance with the present invention, there is provided a method for mounting a semiconductor on a circuit substrate which comprises:

preparing a semiconductor part having a surface thereof provided with a plurality of stud-bumps;

preparing a solder substrate having a surface thereof on which solid-solders corresponding to respective ones of the plurality of stud-bumps are arranged;

preparing the circuit substrate having a surface thereof provided with connecting pads corresponding to respective ones of the plurality of stud-bumps;

attaching the corresponding solid-solders on the solder substrate to respective tip ends of the plurality of stud bumps;

separating the solid-solders attached to the tip ends of the stud-bumps from the solder substrate;

contacting the solid-solders attached to respective of the tip ends of the stud-bumps with the corresponding connecting pads; and heating the solid-solders contacted with the corresponding connecting pads thereby establishing solder connection between respective ones of the stud-bumps and the corresponding connecting pads.

In accordance with the present invention, the stud-bumps of the semiconductor part and the connecting pads of the circuit substrate can be connected together by solder by one-time melting of the solder.

In accordance with the present invention, all of the stud-bumps of the semiconductor part are beforehand supplied with an equal amount of solder, respectively, and then the connecting pads of the circuit substrate and the stud-bumps can be connected together by using the solder.

In accordance with the present invention, when the stud-bumps of the semiconductor part are connected with the copper-made connecting pads of the circuit substrate by using the solder containing therein Sn, generation of the intermetallic compound of Sn—Cu is alleviated, and precipitation of crystals such as $Ag_3Sn$ may be suppressed.

Further, in accordance with the present invention, in the case of using the solder of which the major component is tin (Sn), in connection of the stud-bumps of the semiconductor part with the circuit substrate, a rise in the reflow temperature of the solder may be suppressed.

BRIEF DESCRIPTION OF THE DRAWINGS

These and other features of the present invention will be more readily understood from the following detailed description of the various aspects of the invention taken in conjunction with the accompanying drawings.

Figure 1A:
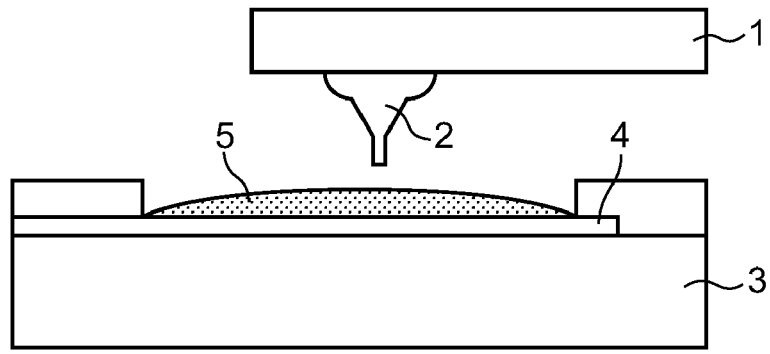
FIGS. 1A to 1C are schematic views illustrating a pre-coat method according to the prior art.
Figure 1B:
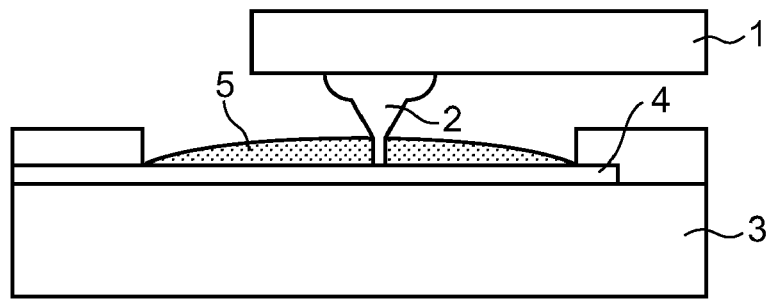
Figure 1C:
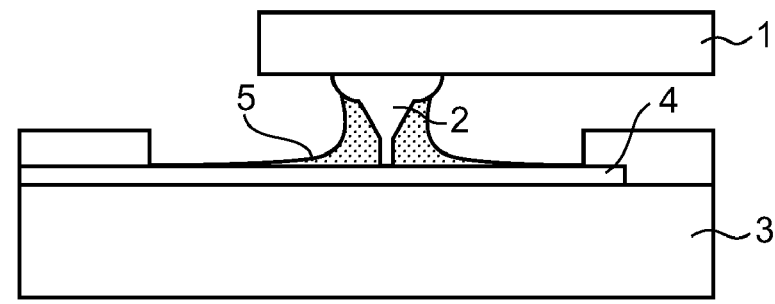
Figure 2A:
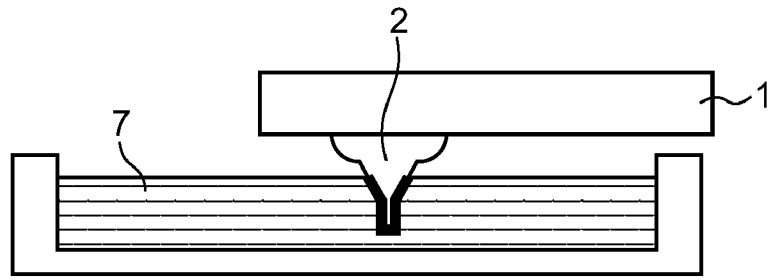
FIGS. 2A to 2C are schematic views illustrating a paste transcription method according to the prior art.
Figure 2B:
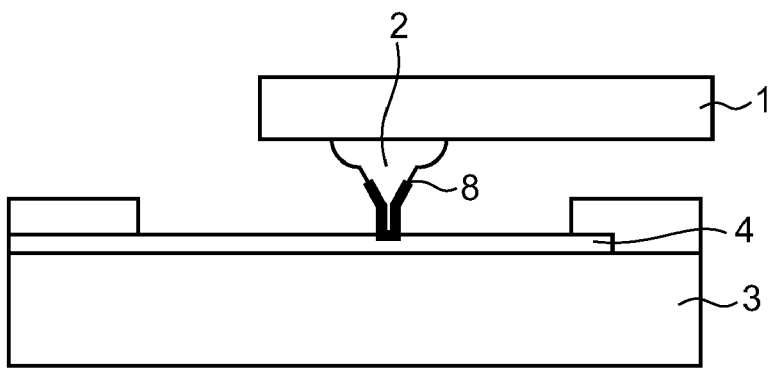
Figure 2C:
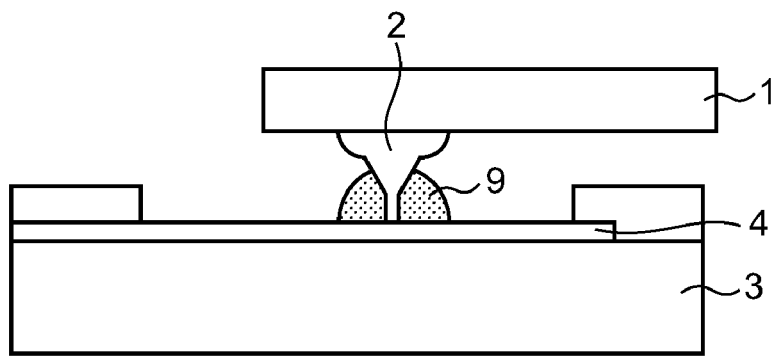

The drawings are merely schematic representations, not intended to portray specific parameters of the disclosure. The drawings are intended to depict only typical embodiments of the disclosure, and therefore should not be considered as limiting the scope of the disclosure. In the drawings, like numbers represent like elements.

DETAILED DESCRIPTION OF THE INVENTION

Figure 3A:
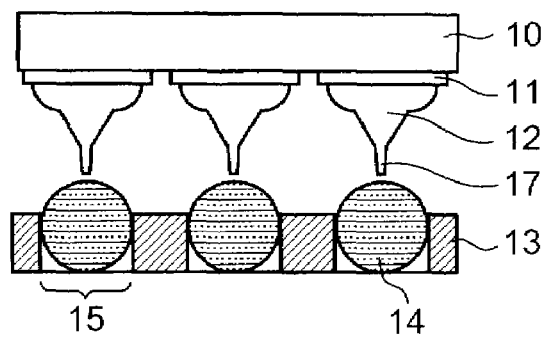
FIGS. 3A to 3E are schematic views, in part cross-section, illustrating a method according to an embodiment of the present invention.
Figure 3B:
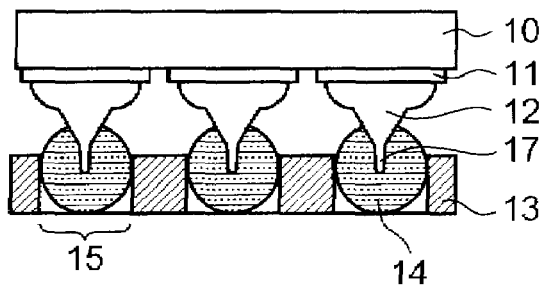

A detailed description of embodiments of the present invention will be provided hereinbelow with reference to the accompanying drawings. FIGS. 3A to 3E are schematic views illustrating a method according to an embodiment of the present invention. In the step (a) shown in FIG. 3A, a semiconductor part 10 provided with a plurality of stud-bumps 12 on connecting pads 11 formed in a surface of the semiconductor part is prepared. Further, in the step (a), a solder substrate 13 on which solid-solders 14 are arranged to correspond to respective of the stud-bumps 12 is prepared. It is to be noted that the solid-solders 14 of FIG. 3A are shaped in a ball or a sphere, respectively. The spherical solder balls 14 may be formed with any arbitrary method such as the conventional printing or spray method and the like. The material of which the solder balls 14 are made may be selected from any arbitrary solder materials including a solitary system material such as a lead (Pb) contained Sn—Pb system material, a lead (Pb)-free Sn—Ag system material or binary or more system material. Each solder ball 14 may have the size thereof (i.e., the diameter thereof) that is optionally determined within a producible range thereof, depending on the size of the respective stud-bumps 12 and the spacing (the pitch) among the stud-bumps. Therefore, the size of the solder ball 14 may thus optionally range from on the order of a nanometer to on the order of a millimeter.

The semiconductor part 10 includes various kinds of electronic parts from large-scale IC chips to other relatively small-scale semiconductor chips such as a micro-processor unit, a system-on-a-chip (SOC) and the like. Each stud-bump 12 has a protrusion-like tip end 17. The shape of the stud-bump 12 is not limited to that shown in FIGS. 3A to 3E and may have the shape of a circular cylinder, a circular cone, a rectangular parallelepiped and so on. The stud-bum 12 is made of either one metal or a combination of two or more metals selected from a group including, for example, gold (Au), silver (Ag), copper (Cu), aluminum (Al), and nickel (Ni). The solder substrate 13 is provided with openings 15 in which the solder balls 14 are received. The number of openings 15 provided in the solder substrate 13 corresponds to at least the number of associated stud-bumps 12. It should be appreciated that each of the openings 15 has depth and width (inner diameter) thereof which permit at least a portion (a lower portion) of the solder ball 14 to be seated therein. Therefore, the respective openings 15 may be formed in through-holes, if they are able to hold the solder balls 14.

Figure 4:
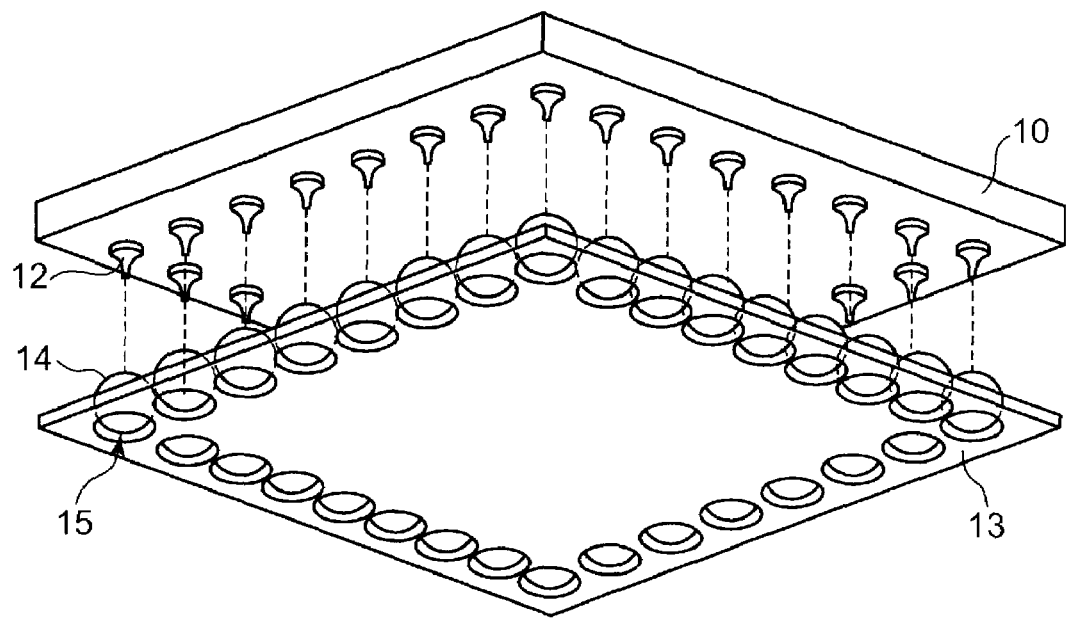
FIG. 4 is an obliquely viewed side view illustrating the relationship between a semiconductor part and a solder substrate.
Figure 5A:
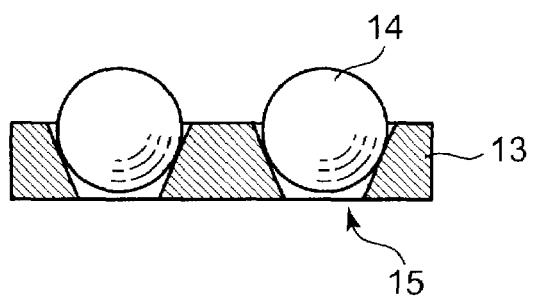
FIGS. 5A and 5B are schematic views illustrating other embodiments of the solder substrate.
Figure 5B:
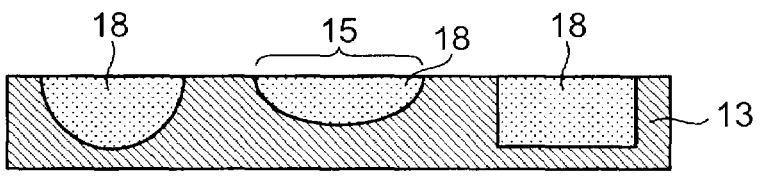

FIG. 4 is an obliquely viewed side view illustrating the positional relationship between the semiconductor part 10 and the solder substrate 13. Referring to FIG. 4, the openings 15 of the solder substrate 13 are disposed so that each opening 15 confronts one of the stud-bumps 12 of the semiconductor part 10 by one-to-one correspondence. Every opening 15 receives therein the solder ball 14 in a seated manner. FIGS. 5A and 5B are cross-sectional views illustrating other embodiments of the solder substrate 13 and another embodiment of a filled solder 18. In the embodiment shown in FIG. 5A, each of the openings 15 is formed in such a shape that the diameter of the opening 15 is gradually thinned from the surface of the substrate 13 toward the bottom of the opening 15 per se. In the case of this opening shape, the upper edge of the opening 15 is fully wide, and therefore the solder ball 14 can be easily taken out of the opening 15 by the associated stud-bump 12. Alternatively, FIG. 5B indicates a different embodiment in which no solder ball 14 is used. That is to say, the bottomed openings 15 are filled with the solder 18, respectively. In case of this embodiment, there is such a merit that no separate solder ball 14 is required for being prepared beforehand. To the contrary, there is such a demerit that the filled solder 18 may be somewhat difficult to be taken out of the openings 15 by the stud-bumps 12. In order to alleviate this demerit, it is necessary to take such a measure that the bottom surface of each opening 15 is coated with flux before the solder is filled in the opening 15, so that the filled solder 18 is apt to be easily pulled away from the opening 15.

Now, returning to FIG. 3B, in the step (b), the semiconductor part 10 is permitted to approach the solder substrate 13 so that respective stud-bumps 12 are brought into in alignment with the corresponding solder balls 14. Thereafter, the tip ends 17 of the respective stud-bumps 12 are stuck into the corresponding solder balls 14 under such a condition that a force is applied from either the side of the semiconductor part 10 or the solder substrate 13 to promote the sticking of the tip ends 17 into the solder balls 14. The amount of sticking, i.e., the length of entering of the respective tip ends 17 into the corresponding solder balls 14 is adjustably regulated by the strength of the above-mentioned applied force. Incidentally, the application of the force is made to the semiconductor part 10 or the solder substrate 13 either directly by a suitable pressurizing member or indirectly via a pneumatic medium such as the air or a hydraulic medium. Upon sticking of the stud-bumps 12 into the solder balls 14, the solder balls 14 may be heated to a temperature in a range that does not exceed the melting point of the solder. Further, in a case where the tip ends 17 of the stud-bumps 12 fail to stick into the solder balls 14 due to slippage thereof on the surface of the respective solder balls 14, the upper portion of each solder ball 14 may be flattened.

Figure 3C:
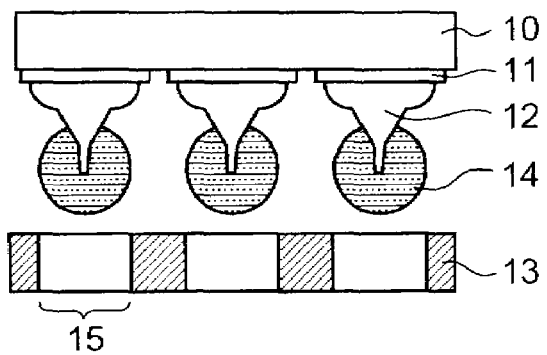

In the step (c) of FIG. 3C, the solder balls 14 attached to the tip ends 17 of the stud-bumps 12 are separated from the solder substrate 13. At this step, the above-mentioned separation may be effected by any one of the movements selected from moving the semiconductor part 10 upwards and moving the solder substrate 13 downwards. In addition, at the moment of the above-mentioned separation of the solder balls 14 form the solder substrate 13, a blow of a gas such as, for example, the air or the nitrogen gas, may be applied from the under side of the solder substrate 13 to thereby assist the solder balls 14 to be easily pulled away from the openings 15. Alternatively, there may be produced a vacuum pressure prevailing between the solder balls 14 and the solder substrate 13, so that an appropriate force caused by a pressure differential is applied to the under portion of the respective solder balls 14 to thereby urge the solder balls 14 to be separated away from the solder substrate 13.

Figure 3D:
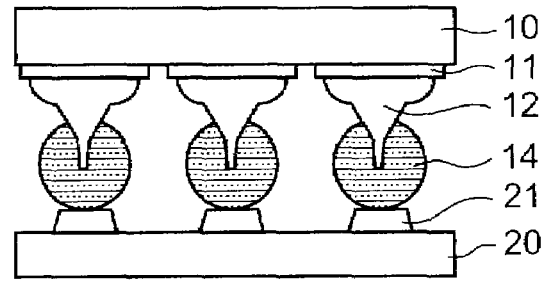

In the step (d) of FIG. 3D, the semiconductor part 10 is moved toward a position above the circuit substrate 20, which is separately prepared beforehand. The circuit substrate 20 is provided, on its surface, with connecting pads 21 disposed to confront each of the plurality of stud-bumps 12 in a one-to-one correspondence. At this moment, the respective connecting pads 21 and the respective stud-bumps 12 with the solder balls 14 attaching thereto are brought into a position such that the latter are in a slight contact with the former. It should be appreciated that the circuit substrate 20 may include substrates of various kinds of materials such as a glass-epoxy substrate, a flexible substrate, e.g., a polyimide substrate, a ceramic substrate, or a silicon substrate. The circuit substrate 20 may further include various circuit substrates such as an ordinary printed circuit board, a multilayer wiring substrate in which an insulating layer and a wiring layer are alternately laminated to form a multilayer form. The connecting pads 21 are connected to the other wiring layer (not shown) on the surface of the substrate. The connecting pads 21 may have the shape of recesses formed, respectively, in the surface of a circuit substrate. Further, the connecting pads 21 are made of either one metal or a combination of two or more metals selected from the group of copper (Cu), gold (Au), silver (Ag), aluminum (Al), tin (Sn) and nickel (Ni). Furthermore, the connecting pads 21 may have a multilayer structure configured with the above-mentioned metallic material or materials.

Figure 3E:
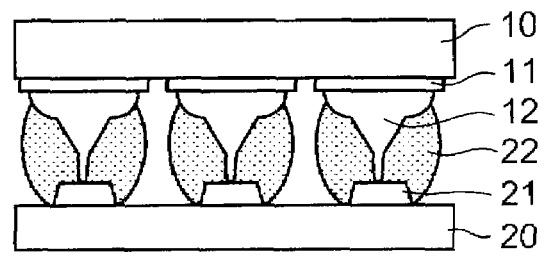

In the step (e) of FIG. 3E, the solder balls 14 are heated (e.g. melted) so as to provide mechanical and electric connection between the respective stud-bumps 12 and the corresponding connecting pads 21. Heating of the solder balls 14 is performed by using either a reflow oven or a flip-chip-bonder. However, another heating means may alternatively be employed. Heating temperature is set at such a temperature that the solder material may be successfully melted to be able to achieve a solder connection between the stud-bumps 12 and the connecting pads 21. Thus, the heating temperature is practically determined depending on the used solder material. The solder balls 14 produce solder-connections 22 after being melted, and the produced solder connections 22 cover the whole surface of the respective connecting pads 21. Nevertheless, it should be appreciated that the solder connections 22 do not extend beyond the connecting pads 21 toward the exterior portions for the reason that an amount of each solder ball 14 is restricted to such an amount that is required only for achieving connection by the solder. Also, since the respective solder balls 14 are all formed to be equivalent, formation of solder bridging between the connecting pads 21, which might cause a short-circuiting can be prevented. When the connecting pads 21 are made of copper (Cu), and when the solder material is made of a material of which the main part is tin (Sn), the melting of the solder occurs only one time, and therefore a production of an intermetallic compound of tin and copper (Sn—Cu) can be alleviated.

The present invention has been described with reference to the accompanying drawings. However, it should be understood that the present invention is not intended to be limited to the described and illustrated embodiments, and that many variations and modifications will occur to a person with an ordinary skill in the art without departing from the scope and gist of the invention as claimed in the claims.

What is claimed is:

1. A method for mounting a semiconductor part on a circuit substrate, comprising:
   preparing the semiconductor part having a surface thereof provided with a plurality of stud-bumps;
   wherein the plurality of stud bumps have protrusion like tip ends;
   wherein the protrusion-like tip ends of the plurality of stud bumps come to a narrow point;
   preparing a solder substrate having a surface with a plurality of openings corresponding to respective ones of the plurality of stud bumps;
   coating the plurality of openings on the solder substrate with flux;
   filling the plurality of openings with solder;
   preparing the circuit substrate having a surface thereof provided with connecting pads corresponding to respective ones of the plurality of stud-bumps;

positioning the semiconductor part above the solder substrate so that the corresponding openings and stud bumps are aligned;

attaching the solder in the plurality of openings to the stud bumps by applying a force to the semiconductor part so the protrusion-like tip ends of the plurality of stud bumps penetrate the solder in the plurality of openings;

separating the solder in the plurality of openings from the solder substrate;

contacting the solder attached to the protrusion like tip ends of the stud-bumps with the corresponding connecting pads; and heating the solid solder attached to the protrusion like tip ends of the stud-bumps thereby achieving solder connection between respective ones of the stud bumps and the corresponding connecting pads.

* * * * *